United States Patent

Iino et al.

[11] Patent Number: 5,976,246
[45] Date of Patent: Nov. 2, 1999

[54] PROCESS FOR PRODUCING SILICON SINGLE CRYSTAL

[75] Inventors: Eiichi Iino; Masanori Kimura; Shozo Muraoka, all of Annaka, Japan

[73] Assignee: Shin-Etsu Handotai Co., Ltd., Tokyo, Japan

[21] Appl. No.: 08/952,481

[22] PCT Filed: Mar. 27, 1997

[86] PCT No.: PCT/JP97/00993

§ 371 Date: Nov. 19, 1997

§ 102(e) Date: Nov. 19, 1997

[87] PCT Pub. No.: WO97/36025

PCT Pub. Date: Oct. 2, 1997

[30] Foreign Application Priority Data

Mar. 27, 1996 [JP] Japan .................................. 8-97761

[51] Int. Cl.$^6$ .................................................. C30B 15/20
[52] U.S. Cl. .................. 117/30; 117/32; 117/917
[58] Field of Search ........................ 117/20, 28, 30, 117/32, 917

[56] References Cited

U.S. PATENT DOCUMENTS 5,196,085  3/1993  Szekely et al. ..................... 117/208
5,306,387  4/1994  Fusegawa et al. .................. 117/28
5,327,007  7/1994  Imura et al. ....................... 257/610

FOREIGN PATENT DOCUMENTS 2 182 262  5/1987  United Kingdom ............ C30B 15/20

*Primary Examiner*—Felisa Hiteshew
*Attorney, Agent, or Firm*—Snider & Chao, LLP; Ronald R. Snider

[57] ABSTRACT

A MCZ method in which the single crystal is pulled while being rotated under the conditions where the crystal growth rate $V_1$ (mm/min) and the crystal circumference velocity $V_2$ (mm/min) satisfy the following relationships:

$$0.4 \leq V_1$$

$$0.628 \times 10^4 \leq V_2 \leq 1.0 \times 10^4$$

and $$V_2 \leq -3.72 \times 10^4 V_1 + 4.35 \times 10^4$$

It is possible to manufacture a silicon single crystal with a large diameter with the MCZ method without causing distortion.

3 Claims, 1 Drawing Sheet

ND CRYSTAL

FIELD OF THE INVENTION

This invention relates to a method of manufacturing a silicon single crystal by the MCZ method.

BACKGROUND OF THE INVENTION

The diameter of silicon single crystals manufactured by using the Czochralski method (CZ method) has been increasing in recent years. In order to grow a large diameter crystal, a large amount, 100 kg or more, of the source material has to be melted using a large diameter quartz crucible. However, there may be a problem in the crystal quality. In order to obtain a quality crystal, the concentration of the interstitial oxygen contained in the crystal has to be low. However, the oxygen contained in the crystal is supplied by dissolution of the quartz crucible. Therefore, the oxygen supplied from the quartz crucible increases, resulting in an increase in the interstitial oxygen, as the quartz crucible becomes larger and the amount of the silicon melt increases.

In addition, when growing a crystal with a larger diameter, the increased amount of the melt increases the instability of the melt due to natural convection, making it harder to grow the crystal.

The MCZ method has been used as a method to solve the aforementioned problem. In the MCZ method, the melt convection and the introduction of oxygen dissolved in the melt into the crystal can be controlled by applying a magnetic field when pulling the crystal.

However, when a crystal with a large diameter is pulled with the MCZ method, a new problem arises in that the crystal becomes distorted. This distortion of the crystal happens more easily when the crystal rotation speed is increased. Once a twist occurs, the crystal is deformed and tends to lose the single crystal quality. When the crystal is distorted, the crystal growth rate has to be reduced and therefore there is a problem in that the manufacturing efficiency decreases, resulting in higher costs.

Therefore, in order to orvercome the problem of distortion, it is necessary to reduce the crystal rotation speed. However, the crystal rotation speed is an important growth parameter for obtaining a homogeneous distribution of the impurity in the obtained wafer, and problems will arise if the crystal rotation speed is reduced below a certain point.

Therefore, the object of the present invention is to provide a method of manufacturing a silicon single crystal with a large diameter using the MCZ method without causing distortion.

DISCLOSURE OF THE INVENTION

The invention provides a method of manufacturing a silicon single crystal with the MCZ method in which the crystal growth rate $v_1$ (mm/min) and the crystal circumference velocity $v_2$ (mm/min) satisfy the following conditions when the single crystal is pulled while being rotated:

$$0.4 \leq v_1$$

$$0.628 \times 10^4 \leq v_2 \leq 1.0 \times 10^4$$

and $$v_2 \leq -3.72 \times 10^4 v_1 + 4.35 \times 10^4$$

The present invention is described in detail below.

The reason why the crystal tends to be distorted in the MCZ method is believed to be as follows: the application of the magnetic field increases the viscosity of the melt and as a result the load against the rotation of the crystal increases. The primary reasons why a crystal with a large diameter is particularly prone to distorting are believed to be as follows: a larger diameter of the crystal results in a larger heat capacity and therefore a reduced crystal cooling rate, and the velocity at the circumference of the crystal increases. That is, the diameter of the crystal, the crystal growth rate and the crystal rotation speed all influence the distortion of the crystal.

We discovered that, in order to solve the aforementioned problem of the distortion of the crystal, it is effective to choose the furnace structure which increases the cooling rate of the crystal or to choose appropriate ranges for the diameter of the crystal, the crystal growth rate and the crystal rotation speed.

However, a change in the cooling rate of the crystal would have a profound effect on the crystal defects and therefore is not practical. Therefore the effective method is to choose appropriate ranges for the diameter of the crystal, the crystal growth rate and the crystal rotation speed.

The upper limit of the crystal rotation speed which does not cause the distortion of the crystal varies depending on the diameter of the crystal, that is, the larger the crystal diameter the lower the upper limit. After a detailed investigation, it was discovered that the distortion did not occur when the velocity of the circumference of the crystal (linear velocity) is a certain value or lower, regardless of the diameter of the crystal.

That is, the growth of the crystal can be carried out without causing the distortion if the crystal growth rate $v_1$ (mm/min) and the crystal circumference velocity $v_2$ (mm/min) satisfy the following conditions when the single crystal is pulled:

$$0.4 \leq v_1$$

$$0.628 \times 10^4 \leq v_2 \leq 1.0 \times 10^4$$

and $$v_2 \leq -3.72 \times 10^4 v^1 + 4.35 \times 10^4$$

These conditions correspond to the area enclosed by line segments in FIG. 1.

The upper limit of the crystal rotation speed is determined either as a point above which no significant improvement in quality is expected or a point at which the deformation occurs. Similarly, the lower limit is a point where a problem in the crystal quality develops, which is mostly determined by the velocity of the crystal circumference. The upper limit of the crystal growth rate is where a problem in the crystal quality develops and it is correlated with the crystal rotation speed. The lower limit of the crystal growth rate is determined by a problem such as a reduction in productivity.

The diameter of the crystal is not limited as long as the aforementioned conditions are satisfied. This method is particularly effective for crystals with a large diameter, 8 inches or more.

THE BEST MODES OF THE EMBODIMENTS

Examples of the present invention are described below.

150 kg of the silicon raw material was melted in a quartz crucible with a diameter of 600 mm. Crystal rods with a diameter of 8 inches and 12 inches were grown. While the crystals were being grown, a horizontal magnetic field of 0.4 T was applied. Table 1 shows whether there was a deformation of the crystals or not and whether the quality was good or not after the crystals were grown with various settings of the crystal rotation speed and the crystal growth rate. The crystal circumference velocity ($v_2$) is determined by:

$v_2$=crystal rotation speed (rpm)×crystal circumference (mm)

=crystal rotation speed (rpm)×crystal diameter (mm)×3.14

The deformation and the quality of the crystals were evaluated by the following method.

(Deformation of the crystal)

If distortion occurs when the crystal is growing, the crystal will be deformed. Whether or not the crystal is deformed can be determined by observing crystal habit lines showing on the surface of the crystal. Crystal habit lines on a crystal which is not deformed are continuous without breaks in the middle. Crystal habit lines on a crystal which is deformed are broken in the middle and temporarily bifurcated. Therefore, the crystal habit lines were observed for breaks and cases where the crystal habit lines were broken were evaluated as deformed, and cases where the crystal habit lines were not broken were evaluated as not deformed.

(Quality of the crystal)

The quality of the crystal was evaluated based on the in-plane distribution of the interstitial oxygen concentration in a cross section of the crystal. The interstitial oxygen concentration $X_c$ at the center of the crystal cross section and the interstitial oxygen concentration $X_{10}$ at a point 10 mm away from the periphery toward the center were measured and the following value (%) was calculated:

$$X=|(X_c-X_{10})|/X_c \times 100$$

The cases where this value was 8% or less were evaluated as good and the cases where this value was more than 8% were evaluated as poor.

TABLE 1

| Diameter | Crystal rotation speed (rpm) | Crystal circumference velocity (mm/min) | Crystal growth rate (mm/min) | Crystal deformation | Crystal quality X (%) | Evaluation |
|---|---|---|---|---|---|---|
| 8" | 18 | $1.13 \times 10^4$ | 0.9 | Deformed | $\leq+4$ | Good |
|  | 15 | $0.492 \times 10^4$ | 0.9 | Not deformed | $\leq+4$ | Good |
|  | 11 | $0.691 \times 10^4$ | 0.6 | Not deformed | $\leq+6$ | Good |
|  | 8 | $0.502 \times 10^4$ | 0.9 | Not deformed | $\leq+10$ | Poor |
| 12" | 16 | $1.51 \times 10^4$ | 0.8 | Deformed | $\leq+4$ | Good |
|  | 10 | $0.942 \times 10^4$ | 0.8 | Not deformed | $\leq+4$ | Good |
|  | 8 | $0.754 \times 10^4$ | 0.6 | Not deformed | $\leq+6$ | Good |
|  | 5 | $0.471 \times 10^4$ | 0.8 | Not deformed | $\leq+10$ | Poor |

Figure 1:
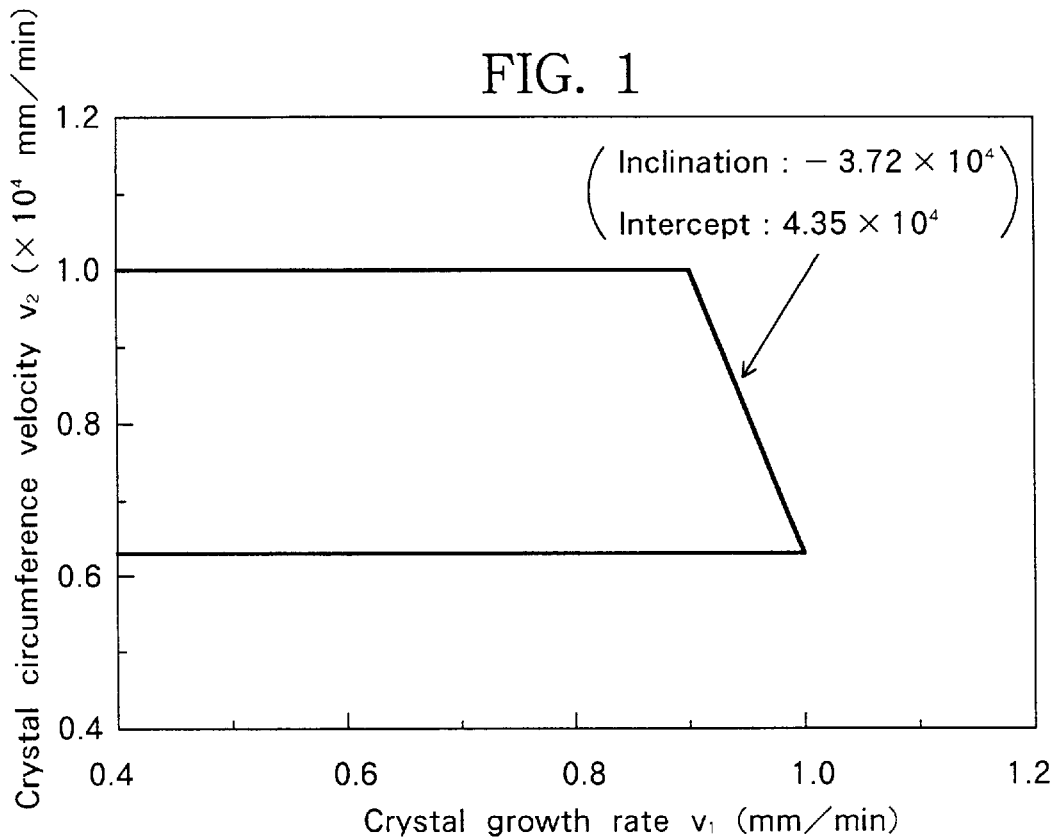
FIG. 1 shows appropriate ranges of the crystal growth rate and the crystal rotation speed in the present invention.
Figure 2:
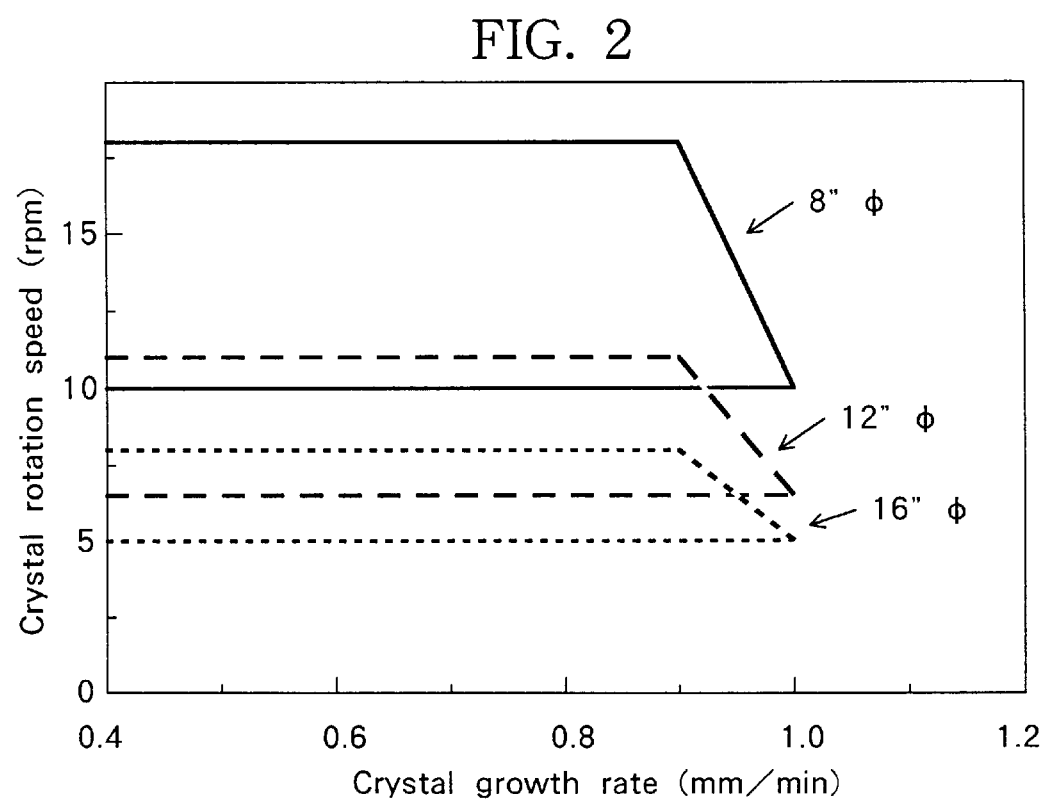
FIG. 2 shows appropriate ranges of the crystal growth rate and the crystal rotation speed when growing crystals with various diameters.

FIG. 2 shows appropriate ranges of the crystal growth rate and the crystal rotation speed when growing crystals with a diameter of 8", 12"and 16".

INDUSTRIAL APPLICABILITY OF THE INVENTION

As described thus far, according to the present invention, a silicon single crystal with a large diameter an be efficiently manufactured with the MCZ method without causing distortion.

We claim:

1. A method of manufacturing a silicon single crystal with the MCZ method in which the crystal growth rate $v_1$ (mm/min) and the crystal circumference velocity $v_2$ (mm/min) satisfy the following conditions when the single crystal is pulled while being rotated:

$0.4 \leq v_1$ $0.628 \times 10^4 \leq v_2 \leq 1.0 \times 10^4$ and $v_2 \leq -3.72 \times 10^4 v_1 + 4.35 \times 10^4$.

2. A method in accordance with claim 1 wherein crystal quality is evaluated based on in-plane distribution of interstitial oxygen concentration in a cross section of the silicon single crystal.

3. A method in accordance with claim 2 wherein the interstitial oxygen is maintained at a low level.

* * * * *